(12) United States Patent
Moriyama et al.

(10) Patent No.: US 10,693,032 B2
(45) Date of Patent: Jun. 23, 2020

(54) METHOD FOR PRODUCING GROUP III NITRIDE SEMICONDUCTOR, SEED SUBSTRATE AND GROUP III NITRIDE SEMICONDUCTOR CRYSTAL

(71) Applicant: TOYODA GOSEI CO., LTD., Kiyosu-shi (JP)

(72) Inventors: Miki Moriyama, Kiyosu (JP); Shiro Yamazaki, Kiyosu (JP); Shohei Kumegawa, Kiyosu (JP)

(73) Assignee: TOYODA GOSEI CO., LTD., Kiyosu-shi, Aichi-ken (JP)

( * ) Notice: Subject to any disclaimer, the term of this patent is extended or adjusted under 35 U.S.C. 154(b) by 141 days.

(21) Appl. No.: 15/713,967

(22) Filed: Sep. 25, 2017

(65) Prior Publication Data

US 2018/0097142 A1  Apr. 5, 2018

(30) Foreign Application Priority Data

Sep. 30, 2016 (JP) .................................. 2016-193608

(51) Int. Cl.
*C30B 19/02* (2006.01)
*H01L 31/18* (2006.01)
(Continued)

(52) U.S. Cl.
CPC ............ *H01L 31/1856* (2013.01); *C30B 9/06* (2013.01); *C30B 9/10* (2013.01); *C30B 9/12* (2013.01); *C30B 19/00* (2013.01); *C30B 19/02* (2013.01); *C30B 19/12* (2013.01); *C30B 25/02* (2013.01); *C30B 25/18* (2013.01); *C30B 29/406* (2013.01); *Y02E 10/544* (2013.01)

(58) Field of Classification Search
CPC ....... C30B 29/406; C30B 19/02; C30B 19/12; C30B 25/02; C30B 25/18; C30B 9/10; C30B 19/00; C30B 9/06; C30B 9/12
See application file for complete search history.

(56) References Cited

U.S. PATENT DOCUMENTS

| 8,795,431 B2 | 8/2014 | Imai et al. | |
|---|---|---|---|
| 2003/0145783 A1* | 8/2003 | Motoki | C30B 25/02 117/89 |

(Continued)

FOREIGN PATENT DOCUMENTS

WO   WO 2012/128375 A1   9/1920

*Primary Examiner* — Matthew J Song
(74) *Attorney, Agent, or Firm* — McGinn I. P. Law Group, PLLC

(57) ABSTRACT

The seed substrate comprises a base substrate and a base layer comprising a Group III nitride semiconductor formed on the base substrate, which has a high dislocation density region and a low dislocation density region. The planar pattern of the high dislocation density region is a honeycomb pattern. A hollow exists between the base substrate and the low dislocation density region. The object layer is grown through a flux method using the seed substrate. The high dislocation density region is melted back at an initial stage of crystal growth, and thereafter, the object layer is grown on the top surface of the low dislocation density region. A cavity remains between the high dislocation density region and the object layer. The presence of the cavity and the hollow makes easy to peel the object layer from the seed substrate.

10 Claims, 7 Drawing Sheets

(51) Int. Cl.
*C30B 29/40* (2006.01)
*C30B 9/12* (2006.01)
*C30B 19/12* (2006.01)
*C30B 25/02* (2006.01)
*C30B 9/10* (2006.01)
*C30B 19/00* (2006.01)
*C30B 9/06* (2006.01)
*C30B 25/18* (2006.01)

(56) References Cited

U.S. PATENT DOCUMENTS

| | | | |
|---|---|---|---|
| 2011/0260295 A1* | 10/2011 | Hirota | C30B 19/00 257/615 |
| 2013/0199438 A1* | 8/2013 | Nagai | C30B 19/12 117/58 |
| 2014/0014028 A1 | 1/2014 | Imai et al. | |
| 2014/0363954 A1* | 12/2014 | Kumegawa | H01L 21/02658 438/498 |
| 2019/0119112 A1* | 4/2019 | Yoshida | C23C 16/34 |

* cited by examiner

METHOD FOR PRODUCING GROUP III NITRIDE SEMICONDUCTOR, SEED SUBSTRATE AND GROUP III NITRIDE SEMICONDUCTOR CRYSTAL

BACKGROUND OF THE INVENTION

Field of the Invention

The present invention relates to a method for producing a Group III nitride semiconductor through a flux method. The present invention also relates to a seed substrate employed for growing a Group III nitride semiconductor through a flux method.

Background Art

As a method for growing a Group III nitride semiconductor crystal, a flux method is known, in which nitrogen is dissolved in a molten mixture of alkali metal and Group III element such as Ga, and a Group III nitride semiconductor is epitaxially grown in liquid phase. A flux method in which Na (sodium) is generally used as alkali metal, is referred to as the Na flux method.

In the Na flux method, a seed substrate (template substrate) having a GaN layer grown through MOCVD or a similar technique on a base substrate made of sapphire or a similar material is employed, and GaN is grown on the seed substrate. Since there is a difference in the linear expansion coefficients of the base substrate and the GaN crystal, fracture or crack may easily occur in the GaN crystal grown during cooling after the growth is finished. To prevent this, the seed substrate is processed to easily peel the grown GaN crystal from the base substrate. As a peeling method, it is known that a mask is formed on the GaN layer of the seed substrate to expose the surface of the GaN layer in a periodic dot pattern, or trenches are formed on the GaN layer.

International Patent Publication No. WO 2012/128375 discloses that a seed substrate employed for growing GaN through a flux method has a structure in which a buffer layer and a GaN seed crystal layer are sequentially deposited on a base substrate. The seed crystal layer is patterned in a stripe pattern by trenches reaching the base substrate, and an AlN or AlGaN exposed layer is formed in the bottom of each trench. By employing such a seed substrate, the grown GaN crystal is easily peeled off, and a good quality GaN crystal with a low dislocation density is obtained.

However, in the flux method, the dislocation density is drastically decreased at an initial stage of growth so that the dislocation density difference is large along the thickness direction. Therefore, large warpage occurs in the peeled GaN crystal. Due to this warpage, the GaN crystal is hard to grind, the GaN crystal is flattened by grinding in a warped state, and variation in crystal orientation arises. As a result, the GaN crystal has a widened off-angle distribution. Warpage causes a problem particularly when a large-area substrate is employed, and mass productivity is reduced.

When the seed substrate is processed to make the GaN crystal easy to peel by the method disclosed in International Patent Publication No. WO 2012/128375, there was a problem that the quality of the GaN crystal is easily deteriorated. That is, it was difficult to achieve both high quality and peeling property of the GaN crystal.

SUMMARY OF THE INVENTION

In view of the foregoing, an object of the present invention is to improve peeling property between a seed substrate and a Group III nitride semiconductor crystal, and reduce the warpage of Group III nitride semiconductor crystal when a Group III nitride semiconductor crystal is grown on a seed substrate through a flux method.

The present invention relates to a method for producing a Group III nitride semiconductor by growing a Group III nitride semiconductor through a flux method using a molten mixture of alkali metal and Group III metal on a seed substrate, wherein the seed substrate has a base substrate and a base layer comprising a Group III nitride semiconductor grown on the base substrate, and a distribution of a dislocation density in the base layer has a two-dimensional periodic distribution in a direction parallel to the main surface thereof. The two-dimensional periodic distribution may be a periodic square wave function or a periodic continuous function such as a sine wave or a triangle wave.

The present invention relates to a seed substrate for growing a Group III nitride semiconductor through a flux method using a molten mixture of alkali metal and Group III metal, the seed substrate comprising a base substrate and a base layer comprising a Group III nitride semiconductor formed on the base substrate, wherein a distribution of a dislocation density in the base layer has a two-dimensional periodic distribution in a direction parallel to the main surface thereof. The two-dimensional periodic distribution may be a periodic square wave function or a periodic continuous function such as a sine wave or a triangle wave.

The base layer has a high dislocation density region and a low dislocation density region having a dislocation density lower than that of the high dislocation density region, and the distribution of the dislocation density has a two-dimensional periodic pattern comprising the high dislocation density region and the low dislocation density region. The high dislocation density region has a planar honeycomb pattern in which regular hexagons are arranged in an equilateral triangular lattice, and the low dislocation density region may have a planar pattern which fills spaces among the regular hexagons of the high dislocation density region.

The method for producing a seed substrate may comprise a first step of forming a precursor layer of the base layer on the base substrate, a second step of forming a trench so as to reach the base substrate in the precursor layer and making the remaining portion except the trench of the precursor layer the high dislocation density region, and a third step of forming the low dislocation density region by laterally regrowing a Group III nitride semiconductor from a side surface of the trench and covering the trench to make the base layer.

The precursor layer means au uniform layer before forming the low dislocation density region.

When forming the above trench, the precursor layer may be removed to form a ring-shaped step (trench) over the whole periphery of the base substrate. The width of the step is 2 mm to 6 mm. Through forming the step over the whole periphery of the base substrate, the occurrence of fracture or crack can be suppressed when an object layer comprising a Group III nitride semiconductor formed through a flux method is peeled off from the base substrate.

In the above method for producing a seed substrate, in the second step, the trench may be formed even on the surface of the base substrate until the base substrate is etched. In the third step, a hollow may remain between the base substrate and the low dislocation density region by preventing the trench formed on the base substrate from being filled with the low dislocation density region. Thereby, peeling property between the seed substrate and the object layer of the Group III nitride semiconductor grown through the flux method can be improved. The step (trench) may be formed over the whole periphery of the base substrate until the base substrate is etched.

In the present invention, the high dislocation density region is melted back at an initial stage of crystal growth of an object layer comprising a Group III nitride semiconductor through a flux method, and thereafter, the object layer is formed so as to cover holes formed due to melting back on the top surface of the low dislocation density region, and to remain cavities between the object layer and the high dislocation density region. This can further improve peeling property between the seed substrate and the object layer of grown Group III nitride semiconductor crystal.

The average dislocation density of the base layer is preferably $5 \times 10^8/cm^2$ or less. The dislocation density of the object layer of grown Group III nitride semiconductor crystal can be reduced, and warpage also can be further reduced.

The present invention is preferable when a seed substrate having a diameter of two inches or more is employed. The larger the diameter of the seed substrate, the larger the warpage of the grown Group III nitride semiconductor crystal. However, according to the present invention, even when the seed substrate having a diameter of two inches or more is employed, warpage can be effectively reduced. It is particularly preferable when a seed substrate having a diameter of three inches or more is employed.

According to the present invention, peeling property between the seed substrate and the object layer of grown Group III nitride semiconductor crystal is improved, thereby a large-area Group III nitride semiconductor crystal wafer having no fracture or crack can be obtained with a high yield. The dislocation density of the wafer of Group III nitride semiconductor crystal can be reduced. Warpage of the wafer of Group III nitride semiconductor crystal can be reduced. Therefore, the wafer of Group III nitride semiconductor crystal is easy to grind, and a high quality Group III nitride semiconductor wafer with a narrow off-angle distribution and a low dislocation density can be produced.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

In the method for producing a Group III nitride semiconductor according to the present invention, a Group III nitride semiconductor is grown through a flux method. Firstly, an outline of a flux method will be described.

(Outline of Flux Method)

The flux method employed in the present invention is a method for epitaxially growing a Group III nitride semiconductor in liquid phase by supplying and dissolving a gas containing nitrogen in a molten mixture containing alkali metal as a flux and Group III metal as a raw material. In the present invention, a seed substrate 1 is placed in a molten mixture, and a Group III nitride semiconductor crystal is grown on the seed substrate 1.

The Group III metal as a raw material is at least one species of Ga (gallium), Al (aluminum), and In (indium). Composition of the Group III nitride semiconductor being grown can be adjusted depending on the ratio of the Group III metals. Among them, only Ga is particularly preferred.

As alkali metal being a flux, Na (sodium) is generally used. However, K (potassium) may also be used, or a mixture of Na and K may also be used. Alternatively, Li (lithium) or alkaline earth metal may be used in combination with the alkali metal.

C (carbon) may be added to the molten mixture. Through addition of C, crystal growth rate can be enhanced.

To the molten mixture, a dopant other than C may be added for controlling physical properties (e.g., conduction type and magnetism) of the Group III nitride semiconductor to be grown, promoting crystal growth, suppressing formation of miscellaneous crystals, controlling growth direction, etc. For example, Ge (germanium) or the like may be used as an n-type dopant, and Mg (magnesium), Zn (zinc), Ca (calcium) or the like may be used as a p-type dopant.

The gas containing nitrogen is a gas of a compound containing nitrogen as an essential element (e.g., molecular nitrogen or ammonia), or a mixture of such gases. Alternatively, the nitrogen-containing gas may be diluted with an inert gas (e.g., rare gas).

(Structure of Seed Substrate)

In the method for producing a Group III nitride semiconductor according to the present invention, a seed substrate (seed crystal) 1 is placed in a molten mixture, and a Group III nitride semiconductor is grown on the seed substrate 1. The seed substrate 1 has the following structure.

Figure 1:
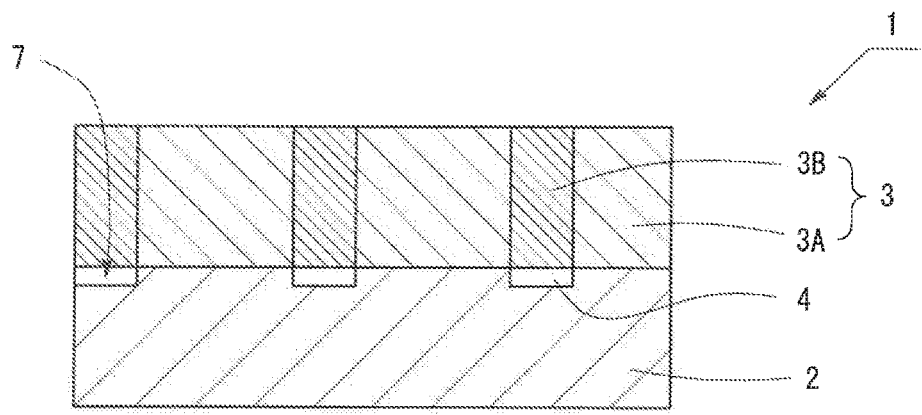
FIG. 1 is a sectional view showing the structure of a seed substrate.

As shown in FIG. 1, the seed substrate 1 has a structure in which a Group III nitride semiconductor layer 3 (i.e., a base layer) having a c-plane main surface is formed via a buffer layer (not illustrated) on a base substrate 2 as a base. FIG. 1 is a partial sectional view of the center part of the base substrate 2.

The base substrate 2 may be made of any material as long as a Group III nitride semiconductor can be grown thereon. However, a material not containing Si is preferable. When Si is dissolved in the molten mixture, crystal growth of Group III nitride semiconductor is hindered. For example, sapphire, ZnO, or spinel may be used.

The diameter of the base substrate 2 is preferably two inches or more. The larger the diameter of the base substrate 2, the easier the occurrence of warpage, thereby the effect of suppressing such regions is enhanced by the present invention. When the diameter of the base substrate 2 is three inches or more, the present invention is particularly effective.

The Group III nitride semiconductor layer 3 on the base substrate 2 may be a Group III nitride semiconductor having any composition such as GaN, AlGaN, and AlN. The Group III nitride semiconductor layer 3 may be grown through any method such as MOCVD, HVPE, and MBE. However, MOCVD or HVPE is preferably employed in terms of crystallinity or growth time.

The Group III nitride semiconductor layer 3 may have any thickness, however, the thickness is preferably 2 μm or more. In the flux method, the Group III nitride semiconductor layer 3 may undergo melting back at an initial stage of crystal growth. Therefore, the Group III nitride semiconductor layer 3 needs to have a thickness such that the base substrate 2 is not exposed even if the Group III nitride semiconductor layer 3 is completely removed (melted back). As used herein, melting back refers to dissolving the Group III nitride semiconductor in the molten mixture to be removed. However, when the Group III nitride semiconductor layer 3 is too thick, large warpage occurs on the seed substrate 1. Therefore, the thickness of the Group III nitride semiconductor layer 3 is preferably 10 μm or less.

Figure 2:
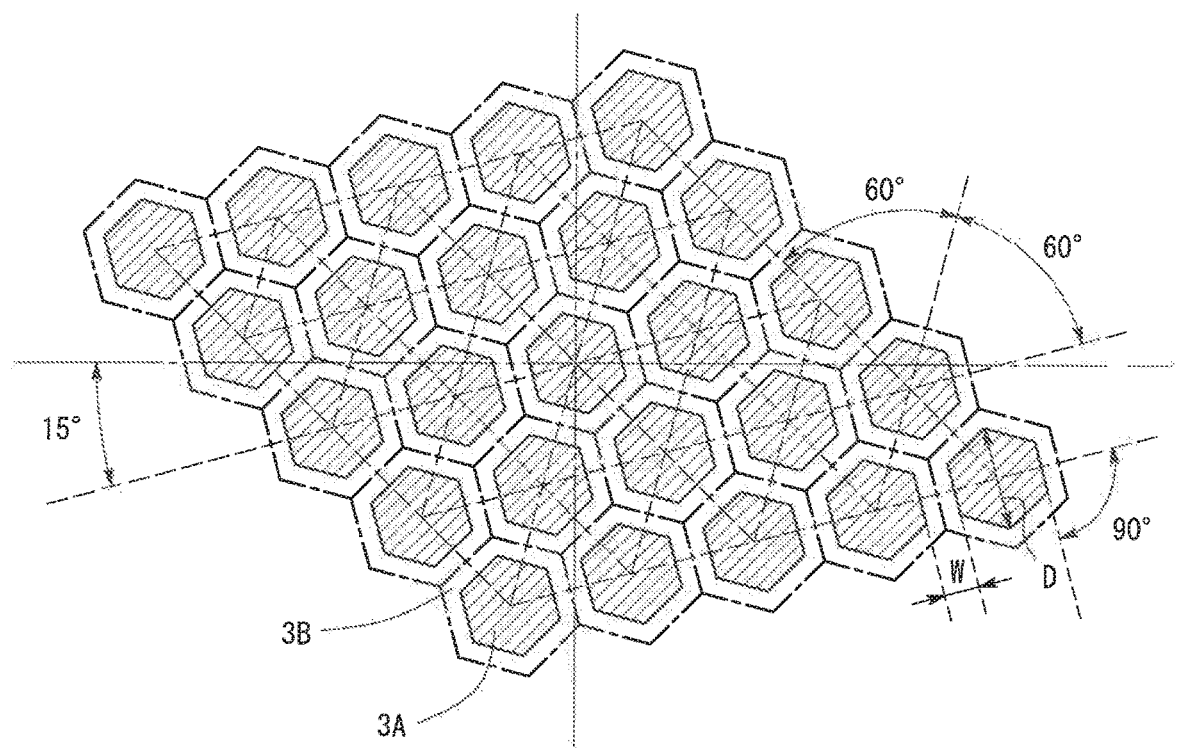
FIG. 2 is a plan view from the above of the seed substrate.

The Group III nitride semiconductor layer 3 has a high dislocation density region 3A and a low dislocation density region 3B having a dislocation density lower than that of the high dislocation density region 3A. FIG. 2 shows a planar pattern of the Group III nitride semiconductor layer 3. As shown in FIG. 2, the planar pattern of the high dislocation density region 3A is a pattern in which a plurality of regular hexagonal dots are arranged in an equilateral triangular lattice with the sides of the adjacent regular hexagons aligned parallel (honeycomb pattern), and other region (gap, i.e., space separating each regular hexagon) is the low dislocation density region 3B. By the pattern of the high dislocation density region 3A and the low dislocation density region 3B, the distribution of the dislocation density of the Group III nitride semiconductor layer 3 has a two-dimensional periodically increasing or decreasing distribution property in a direction parallel to the main surface thereof. The side surfaces of the high dislocation density region 3A are perpendicular to the main surface of the base substrate 2, and constitute regular hexagonal columns.

The top surface of the low dislocation density region 3B is a seed region on which a Group III nitride semiconductor is grown through a flux method. The high dislocation density region 3A is a region which is melted back at an initial growth stage of Group III nitride semiconductor in the flux method, and the top surface of the high dislocation density region 3A is not a seed substrate.

The orientation of each side of each regular hexagon of the high dislocation density region 3A is preferably m-axis <10-10> of the Group III nitride semiconductor layer 3. A Group III nitride semiconductor can be more uniformly grown on the seed substrate 1, thereby improving the crystal quality.

Figure 5A:
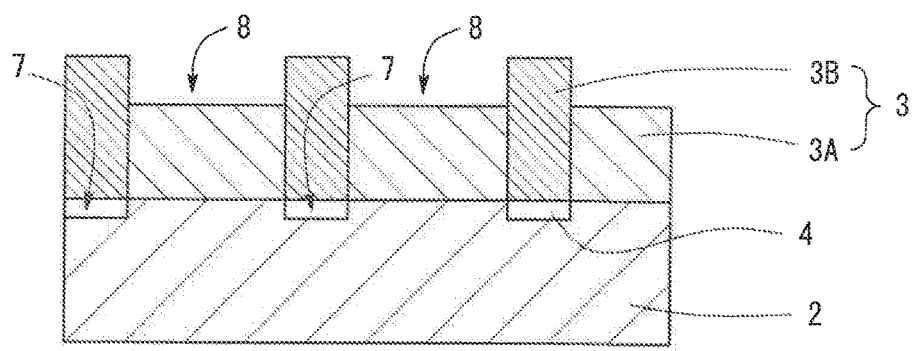
FIGS. 5A to 5D are sketches showing processes for producing a Group III nitride semiconductor.
Figure 5B:
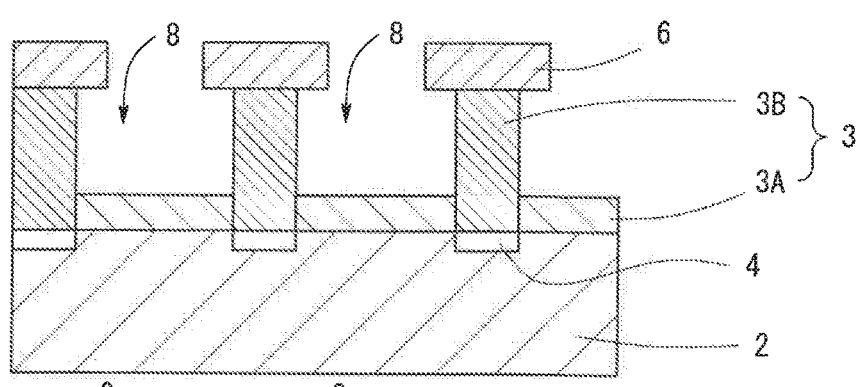
Figure 5C:
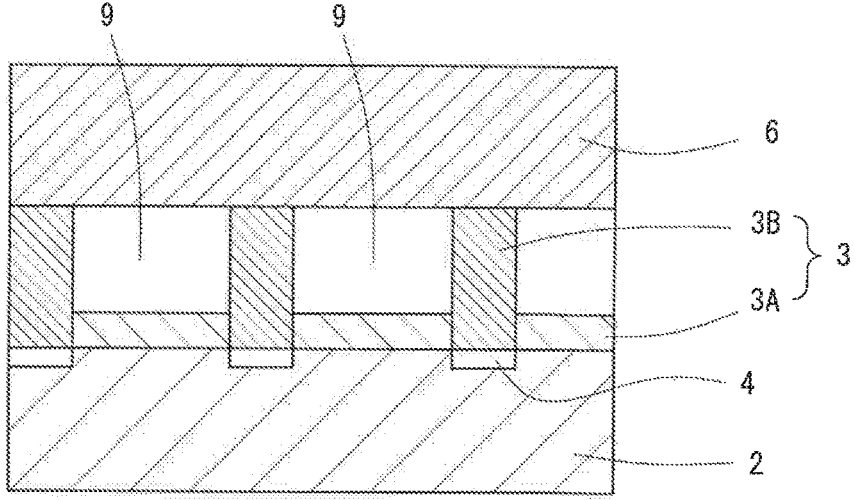

To achieve both high quality of Group III nitride semiconductor crystal 6 being grown through a flux method (FIG. 5C) and improvement of peeling property between the seed substrate 1 and the Group III nitride semiconductor crystal 6, and to reduce warpage in the Group III nitride semiconductor crystal 6, the average dislocation density of the Group III nitride semiconductor layer 3 is preferably $5\times10^8/cm^2$ or less, more preferably, $1\times10^7/cm^2$ to $5\times10^8/cm^2$, and further preferably, $1\times10^7/cm^2$ to $1\times10^8/cm^2$.

To promote melting back, the dislocation density of the high dislocation density region 3A is preferably $1\times10^8/cm^2$ or more.

For the same reason, the ratio of the dislocation density of the low dislocation density region 3B to the dislocation density of the high dislocation density region 3A is preferably ½ or less, more preferably, ⅕ or less, and further preferably, ¹⁄₁₀ or less.

The diameter D (FIG. 2) of the circumscribed circle of each dot (regular hexagon) of the high dislocation density region 3A is preferably 1 μm to 250 μm. When the diameter D is larger than this range, it is difficult to cover cavities generated in the high dislocation density region 3A while a Group III nitride semiconductor is growing through a flux method, thereby making it difficult to obtain uniform flat Group III nitride semiconductor crystal 6. The diameter D is more preferably, 1.5 μm to 190 μm, and further preferably, 2 μm to 170 μm.

A dot interval W of the high dislocation density region 3A (width of the low dislocation density region 3B in FIG. 2) is preferably 2 μm to 40 μm. When W is smaller than this range, the area of the low dislocation density region 3B being a seed is reduced, and a Group III nitride semiconductor is difficult to grow.

The rate of the area of the high dislocation density region 3A to the area of the Group III nitride semiconductor layer 3 is preferably 3% to 45%. Within this range, a Group III nitride semiconductor can be uniformly grown, and peeling property between the seed substrate 1 and the grown Group III nitride semiconductor crystal 6 is also sufficiently improved. The rate of the area of the high dislocation density region 3A to the area of the Group III nitride semiconductor layer 3 is more preferably, 4% to 40%, and further preferably, 6% to 35%.

The planar pattern of the high dislocation density region 3A is not limited to the honeycomb pattern. Each dot may be, for example, a circle, an oval, a polygon such as a triangle or a rectangle, other than a regular hexagon. However, to grow a uniform Group III nitride semiconductor, a rotationally symmetrical shape is preferable. A circle or a regular hexagon is more preferable, and a regular hexagon is particularly preferable. The dot arrangement pattern is not limited to the equilateral triangular lattice. The pattern may be a two-dimensional periodic pattern such as a triangular lattice, a rectangular lattice, and a square lattice. However, for the same reason, a high rotationally symmetrical pattern is preferable, and an equilateral triangular lattice pattern is more preferable. The side surfaces of the high dislocation density region 3A may not be perpendicular to the main surface of the base substrate 2 and may be inclined to.

The dislocation density of the Group III nitride semiconductor layer 3 is discontinuously increasing or decreasing between the high dislocation density region 3A and the low dislocation density region 3B. However, the dislocation density may be continuously increasing or decreasing. In short, as long as the distribution of the dislocation density of the Group III nitride semiconductor layer 3 has a two-dimensional periodically increasing or decreasing distribution property in a direction parallel to the main surface thereof, the Group III nitride semiconductor layer 3 may have any structure.

Figure 4A:
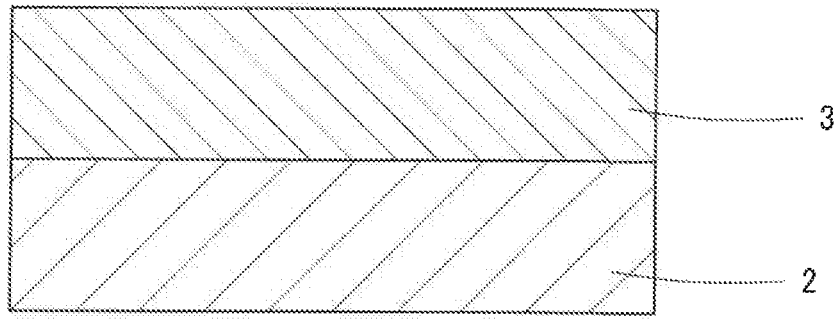
FIGS. 4A to 4D are sketches showing processes for producing a seed substrate.
Figure 4B:
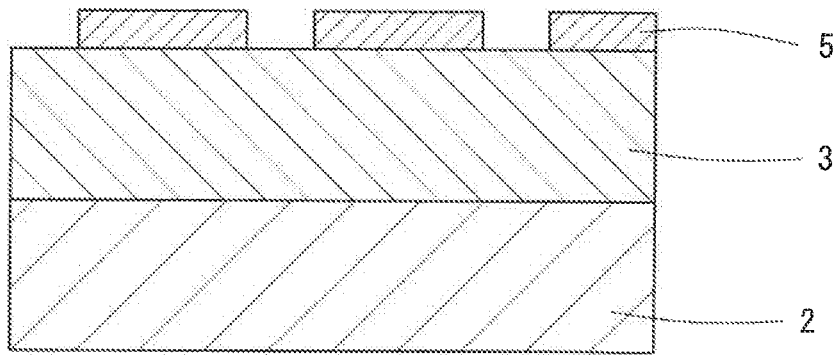
Figure 4C:
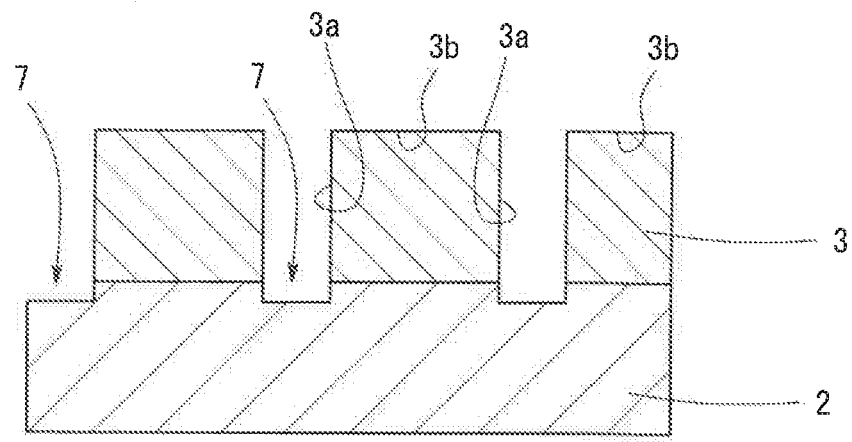
Figure 4D:
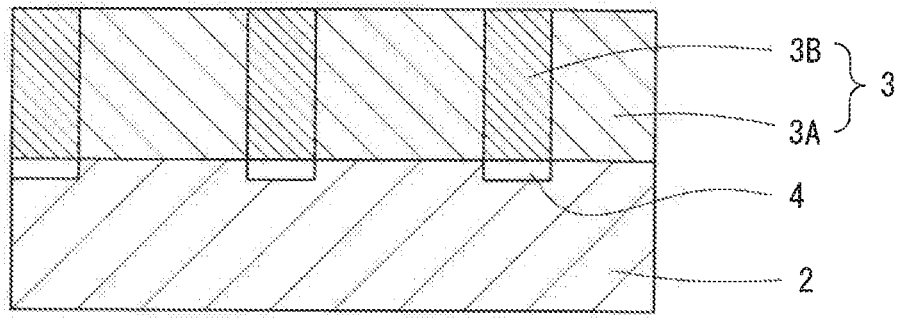
Figure 8A:
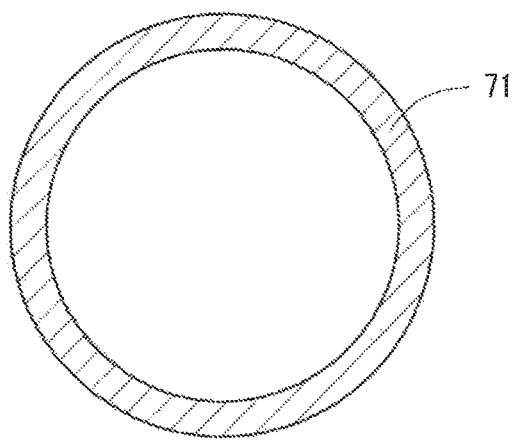
FIGS. 8A and 8B are a plan view and a sectional view showing a step formed over the whole periphery of the seed substrate.
Figure 8B:
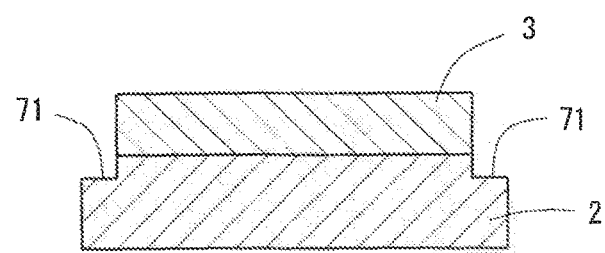

On a region corresponding to the bottom of the low dislocation density region 3B of the surface of the base substrate 2 (the surface with which the Group III nitride semiconductor layer 3 is in contact), a trench 7 is formed by etching the base substrate 2 (FIG. 4C). As shown in FIGS. 8A and 8B, the trench 7 being formed over the whole periphery of the base substrate 2 has a step 71 with a width of 2 mm to 6 mm. The low dislocation density region 3B is disposed in the trench 7 so as not to completely fill in the trench 7. The low dislocation density region 3B is not formed over the whole width of the step 71. Therefore, a hollow exists between the low dislocation density region 3B and the base substrate 2 (FIG. 4D).

The larger the depth from the surface of the base substrate 2 to the bottom of the trench 7, the better the trench. However, the depth is preferably 0.1 µm to 0.3 µm. Within this range, a hollow 4 can be formed so as not to completely fill in the trench 7 when producing the seed substrate 1, and the trench 7 can also be easily formed.

The hollow 4 is not necessarily formed, but is preferably formed to facilitate peeling property between the seed substrate 1 and the grown Group III nitride semiconductor crystal 6.

(Processes for Producing a Seed Substrate 1)

The processes for producing a seed substrate 1 will next be described with reference to FIGS. 4A to 4D. FIGS. 4A to 7B are a partial sectional view of the center part of the seed substrate 1. Firstly, a base substrate 2 is provided, and a Group III nitride semiconductor layer 3 (i.e., a precursor layer which becomes to the base layer after) is formed on the base substrate 2 (refer to FIG. 4A). The Group III nitride semiconductor layer 3 may be grown through any method such as MOCVD, HVPE, and MBE.

On the surface of the Group III nitride semiconductor layer 3, a mask 5 in a honeycomb pattern in which regular hexagon dots are arranged in an equilateral triangular lattice, is formed (refer to FIG. 4B). The mask 5 is patterned through photolithography and RIE (Reactive Ion Etching). The mask 5 may be formed of any material as long as it has etching resistance to the Group III nitride semiconductor layer 3 in the subsequent process, and for example, $SiO_2$ is used.

A region not covered with the mask 5 of the Group III nitride semiconductor layer 3 is dry etched through ICP (Inductively Coupled Plasma) etching, to form a trench 7. At this time, the trench 7 being formed over the whole periphery of the seed substrate 1 is a step 71 in FIGS. 8A and 8B. Dry etching is continuously performed even after the Group III nitride semiconductor layer 3 not covered with the mask 5 is removed and the base substrate 2 is exposed until the surface of the base substrate 2 is etched. In forming the trench 7, the mask 5 is completely etched to expose the Group III nitride semiconductor layer 3 therebelow (refer to FIG. 4C). Thus, the process for removing the mask 5 can be skipped, thereby facilitating the processes for producing the seed substrate 1. At this time, the exposed Group III nitride semiconductor layer 3 may be slightly etched. However, considering loss due to melting back at an initial stage of crystal growth through a flux method, the Group III nitride semiconductor layer 3 is preferably left so as to have a thickness of 2 µm or more. Needless to say, the mask 5 is not removed in forming the trench, and the mask 5 may be removed after the formation of the trench 7.

Through the process for forming the trench 7, the Group III nitride semiconductor layer 3 has a planar pattern in which regular hexagonal dots are arranged in an equilateral triangular lattice. The remaining region of the Group III nitride semiconductor layer 3 is the high dislocation density region 3A.

Subsequently, the Group III nitride semiconductor layer 3 is regrown through MOCVD. Regrowth starts on the side surfaces 3a and the top surface 3b of each hexagonal-columnar Group III nitride semiconductor layer 3. Crystal is laterally grown on the side surfaces 3a of the Group III nitride semiconductor layer 3 so as to fill in gaps among the regular hexagons. The dislocation is bent in the regrown region due to lateral growth, and the dislocation density is reduced. The laterally regrown region is the low dislocation density region 3B. In this lateral growth, the low dislocation density region 3B is grown so as not to completely fill in the trench 7 which is formed on the base substrate 2. Therefore, a hollow 4 exists between the low dislocation density region 3B and the base substrate 2.

In the step 71 formed over the whole periphery of the seed substrate 1, the width of the low dislocation density region 3B is W/2, that is, approximately 1 µm, and the low dislocation density region 3B is not formed over the entire width of the step 71. When the growth of the Group III nitride semiconductor layer 3 is completed, the base substrate 2 is exposed in the step 71.

On the other hand, the Group III nitride semiconductor regrown on the top surface of the Group III nitride semiconductor layer 3 takes over the dislocation in the high dislocation density region 3A, and the dislocation density does not remarkably change. In this way, with the high dislocation density region 3A and the low dislocation density region 3B, the Group III nitride semiconductor layer 3 as the base layer is formed of which the distribution of the dislocation density has a two-dimensional periodically increasing or decreasing distribution property in a direction parallel to the main surface thereof (refer to FIG. 4D). The above is the method for producing a seed substrate 1.

(Structure of Crystal Production Apparatus)

In the method for producing a Group III nitride semiconductor according to the present invention, for example, a crystal production apparatus 10 having the following structure is employed.

Figure 3:
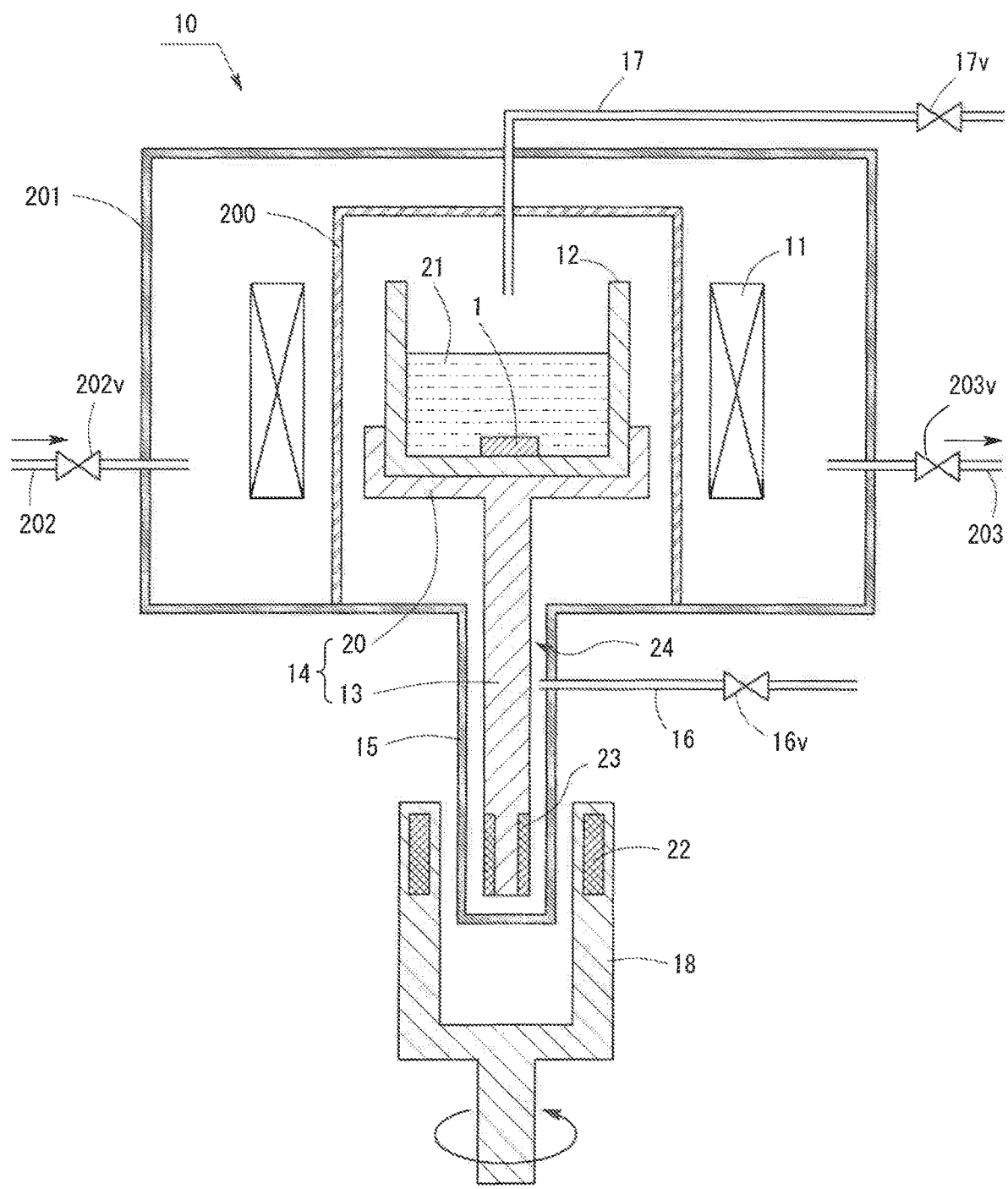
FIG. 3 is a sketch showing the structure of crystal production apparatus.

FIG. 3 is a sketch showing the structure of a crystal production apparatus 10 employed in producing a Group III nitride semiconductor through a flux method. As shown in FIG. 3, the crystal production apparatus 10 includes a reaction vessel 200, a crucible 12 being placed in the reaction vessel 200 and holding a molten mixture 21 of alkali metal and Group III metal, a heating apparatus 11 heating the reaction vessel 200, a holding part 14 holding the crucible 12 and having a rotation axis 13. The crystal production apparatus 10 also includes a pressure container 201 including the reaction vessel 200 and the heating apparatus 11 so that the pressure container 201 and the reaction vessel 200 make a double structure. The crystal production apparatus 10 also includes a rotation axis cover 15 being opened and connected to the pressure container 201 and covering the outer part of the pressure container 201 facing the rotation axis 13, a supply pipe 16 being connected to the rotation axis cover 15 to supply nitrogen, a discharge pipe 17 discharging the gas from the inside to the outside of the reaction vessel 200, and a rotation driving unit 18 rotating and moving the rotation axis 13.

The reaction vessel 200 is a heat-resistant hollow cylinder made of stainless steel. In the reaction vessel 200, the crucible 12 held by the holding part 14 is placed. The rotation axis 13 side of the reaction vessel 200 is opened, and the rotation axis 13 passes through from the outside to the inside of the reaction vessel 200.

The pressure container 201 is a pressure-resistant hollow cylinder made of stainless steel. In the pressure container 201, the reaction vessel 200 and the heating apparatus 11 are placed. Through placing the reaction vessel 200 in the pressure container 201 in this way, the reaction vessel 200 does not require particularly high pressure resistance. Thus, the reaction vessel 200 may be made of an inexpensive material, and recyclability is improved.

To the pressure container 201, a supply pipe 202 supplying a gas containing nitrogen, and a discharge pipe 203 are connected. The supply pipe 202 and the discharge pipe 203 are attached with valves 202v and 203v respectively. Through operation of the valves 202v and 203v, the gas amount being introduced in the pressure container 201 is controlled, thereby pressurizing so that the pressure inside the pressure container 201 is substantially equalized with that of the reaction vessel 200.

The crucible 12 is made of BN (boron nitride), and is placed on a tray 20 in the reaction vessel 200. The crucible 12 may be made of a material such as W (tungsten), Mo (molybdenum), alumina, or YAG (yttrium aluminum garnet) other than BN (boron nitride). The crucible 12 holds the molten mixture 21 of alkali metal and Group III metal, and the seed substrate 1 is contained in the molten mixture 21.

The heating apparatus 11 is placed outside the reaction vessel 200 and inside the pressure container 201. The temperature inside the reaction vessel 200 is controlled by means of the heating apparatus 11.

The holding part 14 comprises the tray 20 for placing the crucible 12, and the rotation axis 13 being connected to the tray 20 and passing through from the inside lower part to the outside of the pressure container 201. The end of the rotation axis 13 outside the pressure container 201 is attached with a magnet 23.

The rotation axis cover 15 covers the rotation axis 13 outside the pressure container 201, and is opened and connected to the reaction vessel 200 and the pressure container 201. The rotation axis cover 15 blocks the inside of the pressure container 201 from the outside so that a gap 24 between the rotation axis 13 and the rotation axis cover 15 is continuous with the inside of the reaction vessel 200.

The rotation driving unit 18 has a magnet 22 attached to its outside on the rotation axis cover 15 side. Through rotation of the magnet 22, the rotation axis 13 can be rotated via the magnet 23. The magnet 22 can be moved vertically up and down, thereby moving the rotation axis 13 vertically up and down. Through the use of the magnet, rotation and movement of the rotation axis 13 can be controlled with the inside of the pressure container 201 blocked from the outside by the rotation axis cover 15.

The supply pipe 16 is connected to the rotation axis cover 15, and has a valve 16v. A gas containing nitrogen supplied from the supply pipe 16 is supplied into the reaction vessel 200 through the gap 24 between the rotation axis 13 and the rotation axis cover 15.

The discharge pipe 17 is opened and connected to the reaction vessel 200. The discharge pipe 17 is attached with a valve 17v to control the gas discharge rate. Through operation of the valves 16v and 17v of the supply pipe 16 and the discharge pipe 17, the flow rate and discharge rate of the gas containing nitrogen are controlled, thereby controlling the pressure inside the reaction vessel 200.

The gas containing nitrogen being supplied from the supply pipe 16 passes through the gap 24 between the rotation axis cover 15 and the rotation axis 13 and a gap between the pressure container 201 and the rotation axis 13 in order, and is supplied into the reaction vessel 200. Therefore, vapor of alkali metal is prevented from entering the gap between the rotation axis cover 15 and the rotation axis 13, and the rotation of the crucible 12 is not inhibited. Thus, the composition of the molten mixture 21 is maintained. As a result, the uniformity of the crystal is improved, thereby producing a high quality Group III nitride semiconductor.

When the employed reaction vessel 200 has a pressure resistance, the pressure container 201 is not necessarily employed. In addition, in order to prevent vaporization of alkali metal during crystal growth, the crucible 12 may be provided with a lid. Instead of or in addition to the rotation of the crucible 12, the crucible swinging means may be provided. The pressure container 201 and the reaction vessel 200 constitute a double container. The growth conditions (such as temperature or pressure) may be further stabilized by constituting a triple container.

(Processes for Producing a Group III Nitride Semiconductor)

The method for producing a Group III nitride semiconductor according to the present invention will next be described with reference to FIGS. 5A to 5D.

Firstly, prescribed amounts of alkali metal, Group III metal, and carbon are weighed in the glovebox under the controlled atmosphere such as oxygen density or dew point. A seed substrate 1 and the weighed prescribed amounts of alkali metal and Group III metal are placed in the crucible 12. The crucible 12 is housed in a transfer container and placed on the tray 20 in the reaction vessel 200 without being exposed to the atmosphere. The reaction vessel 200 is sealed, and the reaction vessel 200 is sealed inside the pressure container 201. After evacuating the inside of the pressure container 201, the pressure and temperature of the pressure container 201 are increased. At this time, a gas containing nitrogen is supplied into the reaction vessel 200.

Next, the inside temperature and pressure of the reaction vessel 200 are increased to the temperature and pressure of crystal growth. The crystal growth temperature is 700° C. to 1,000° C., and the crystal growth pressure is 2 MPa to 10 MPa. At this time, the alkali metal and the Group III metal in the crucible 12 are melted to form a molten mixture 21. The molten mixture 21 is stirred by rotating the crucible 12 so that the molten mixture 21 has a uniform concentration distribution of alkali metal or Group III metal.

When nitrogen is dissolved in the molten mixture 21 and the nitrogen concentration of the molten mixture reaches a super-saturation level, crystal growth of Group III nitride semiconductor is started. Until supersaturation is reached, the Group III nitride semiconductor layer 3 is melted back. Melting back is a phenomenon in which the Group III nitride semiconductor layer 3 is dissolved in the molten mixture 21 because nitrogen is unsaturated in the molten mixture 21. The higher the dislocation density, the higher the melting back speed. Therefore, the low dislocation density region 3B is less melted back, and mainly the high dislocation density region 3A is melted back to form holes 8 (refer to FIG. 5A). When melting back proceeds to a certain degree, nitrogen is supersaturated in the molten mixture 21, and melting back is stopped. The holes 8 formed due to melting back may have any depth.

When nitrogen is supersaturated in the molten mixture 21, a Group III nitride semiconductor crystal 6 is grown on the top surface of the low dislocation density region 3B. Since the Group III nitride semiconductor crystal 6 is grown on the low dislocation density region 3B, less dislocation is propagated to the Group III nitride semiconductor crystal 6. Therefore, the Group III nitride semiconductor crystal 6 has a low dislocation density and a high quality. The Group III nitride semiconductor crystal 6 is grown laterally as well as vertically so as to cover the top of the melted back high dislocation density region 3A (refer to FIG. 5B).

As the growth of the Group III nitride semiconductor crystal 6 proceeds, the top of the high dislocation density region 3A is completely covered by lateral growth, to close the holes 8, resulting in a uniformly flat Group III nitride semiconductor crystal 6 having no holes. A region of the holes 8 is covered by the Group III nitride semiconductor crystal 6 so that the holes 8 remain as cavities 9 (refer to FIG. 5C).

Subsequently, heating of the reaction vessel 200 is stopped, to return the conditions to be ambient temperature (25° C.) and pressure (1013 hPa). Thus, growth of the Group III nitride semiconductor is terminated. The seed substrate 1 and the Group III nitride semiconductor crystal 6 have the hollow 4 between the base substrate 2 and the low dislocation density region 3B, and the cavities 9 between the high dislocation density region 3A and the Group III nitride semiconductor crystal 6 as the object layer.

Due to the presence of the hollow 4, the base substrate 2 is not in contact with the low dislocation density region 3B, and is in contact with only the high dislocation density region 3A. Therefore, the contact area between the base substrate 2 and the Group III nitride semiconductor layer 3 is smaller than that when the base substrate 2 is in contact with the entire surface of the Group III nitride semiconductor layer 3.

Due to the presence of the cavities 9, the grown Group III nitride semiconductor crystal 6 is not in contact with the high dislocation density region 3A, and is in contact with only the low dislocation density region 3B. Therefore, the contact area between the Group III nitride semiconductor layer 3 and the Group III nitride semiconductor crystal 6 is smaller than that when the Group III nitride semiconductor crystal 6 is in contact with the entire surface of the Group III nitride semiconductor layer 3.

When the temperature is lowered after the termination of growth, in the seed substrate 1 and the Group III nitride semiconductor crystal 6, a stress occurs due to a difference in the linear expansion coefficient among the base substrate 2, the Group III nitride semiconductor layer 3, and the group III nitride semiconductor crystal 6. As described above, the contact area between the base substrate 2 and the Group III nitride semiconductor layer 3, and the contact area between the Group III nitride semiconductor layer 3 and the Group III nitride semiconductor crystal 6 are made smaller. Therefore, peeling spontaneously occurs due to the stress between the Group III nitride semiconductor crystal 6 and the Group III nitride semiconductor layer 3, or between the base substrate 2 and the Group III nitride semiconductor layer 3. As a result, the base substrate 2 and the grown Group III nitride semiconductor crystal 6 are separated (refer to FIG. 5D). The low dislocation density region 3B and the high dislocation density region 3A connected to the region 3B sometimes remain in the Group III nitride semiconductor crystal 6. However, the remaining regions 3A and 3B can be easily removed from the Group III nitride semiconductor crystal 6 by a method such as applying mechanical impact to them.

The thus-grown grown Group III nitride semiconductor crystal 6 is a high quality crystal having no fracture or crack, a low dislocation density and less warpage. The Group III nitride semiconductor crystal 6 is grown on the low dislocation density region 3B, and the dislocation density of the Group III nitride semiconductor crystal 6 is low even at an initial stage of growth when the thickness is thin. As the thickness of Group III nitride semiconductor crystal 6 being grown through a flux method is increased in accordance with crystal growth, the dislocation density is reduced. However, the dislocation density of the Group III nitride semiconductor crystal 6 is originally low, and the reduction of the dislocation density is small even if the thickness is increased. Therefore, the difference in dislocation density is small in a thickness direction of the Group III nitride semiconductor crystal 6, thereby reducing warpage of the Group III nitride semiconductor crystal 6.

The rear surface of the Group III nitride semiconductor crystal 6 (the surface on the seed substrate 1 side) is in a mirror-state, and has an extremely high flatness. However, periodic fine irregularity structure is actually generated. Fine irregularities are caused because the Group III nitride semiconductor crystal 6 is grown not on the high dislocation density region 3A but on the low dislocation density region 3B. Thus, the periodic fine pattern formed by the low dislocation density region 3B and the high dislocation density region 3A are transferred on the rear surface of the Group III nitride semiconductor crystal 6 to generate a periodic irregularity structure. Therefore, the cycle of the periodic irregularity structure on the rear surface of the Group III nitride semiconductor crystal 6 is the same as the cycle of the low dislocation density region 3B and the high dislocation density region 3A, for example, 3 μm to 100 μm. The depth of the periodic irregularity structure is, for example, 0.1 μm to 0.3 μm.

The effects of the method for producing a Group III nitride semiconductor according to the present invention are as follows. Firstly, peeling property between the seed substrate 1 and the grown Group III nitride semiconductor crystal 6 is improved, thereby a large-area free-standing Group III nitride semiconductor crystal 6 having no fracture or crack and a low dislocation density can be obtained with a high yield. Secondly, the Group III nitride semiconductor crystal 6 has less warpage, thereby facilitating grinding and producing a Group III nitride semiconductor substrate with a narrow off-angle distribution.

Hereinafter, specific embodiments of the present invention will be described with reference to the drawings. However, these embodiments are given only for the purpose of illustration and should not be construed as limiting the invention thereto.

Embodiment 1

The method for producing a GaN according to Embodiment 1 will be described. Firstly, a seed substrate 100 was produced as follows.

Figure 6A:
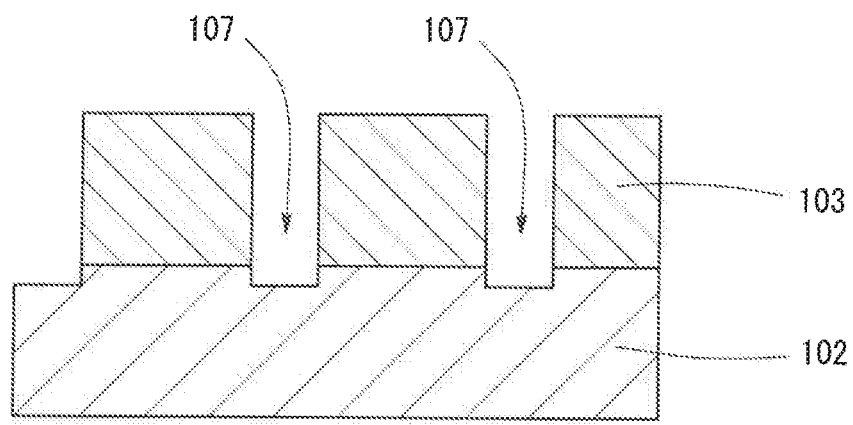
FIGS. 6A and 6B are sketches showing processes for producing a seed substrate according to Embodiment 1.
Figure 6B:
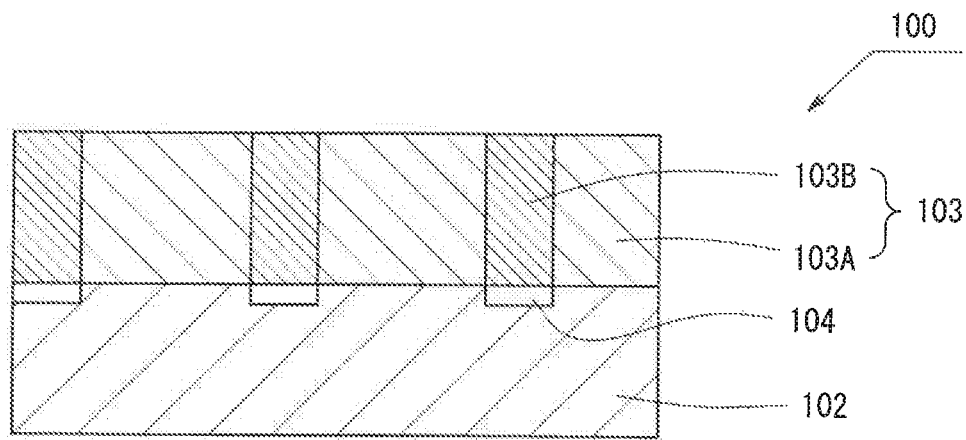

As shown in FIG. 6A, a template was prepared, in which a GaN layer 103 having a thickness of 5 μm was deposited on a base substrate 102 made of sapphire having a diameter of two inches and a thickness of 1 mm. On the GaN layer 103 of the template, a mask made of $SiO_2$ having a prescribed pattern was formed. The mask was patterned through photolithography and RIE. The mask pattern was a regular hexagonal honeycomb pattern, and the interval between the opposite sides of each regular hexagon was 5 μm, and the interval between the adjacent regular hexagons was 2 μm (W of FIG. 2). The GaN layer 103 was etched through ICP until the base substrate 102 is etched by 0.1 mm to 0.3 mm, to form a trench 107 (refer to FIG. 6A). At this time, the mask was all etched, and the GaN layer 103 below the mask was etched up to 3.5 μm.

Subsequently, a GaN layer 103 was regrown through MOCVD on the template. Regrowth starts on the side surfaces and the top surface of each hexagonal-columnar GaN layer 103, and GaN was laterally grown on the side surfaces so as to fill in the gap between the regular hexagons. The thickness of the GaN layer 103 was 5 μm. The dislocation density of the laterally regrown GaN layer 103 was lower than that of the original GaN layer 103. As used herein, the region of the original GaN layer 103 is referred to the high dislocation density region 103A, and the regrown region is referred to the low dislocation density region 103B. The dislocation density of the high dislocation density region 103A was in the order of $1 \times 10^8 / cm^2$, and the dislocation density of the low dislocation density region 103B was in the order of $1\times10^7/cm^2$. The dislocation density was different by one digit between the high dislocation density region 103A and the low dislocation density region 103B. Thus, the GaN layer 103 had the high dislocation density region 103A and the low dislocation density region 103B, and the planar pattern of the high dislocation density region 103A was a regular hexagonal honeycomb pattern. As a result, the distribution of the dislocation density of the GaN layer 103 had a two-dimensional periodically increasing or decreasing distribution property.

The trench 107 on the base substrate 102 was not filled with the low dislocation density region 103B, resulting in generation of a hollow 104. Other region has no hollow, and a uniform GaN layer 103 was grown (refer to FIG. 6B). Through the above procedure, the seed substrate 100 was produced.

Subsequently, the seed substrate 100 was placed in a crucible 12, GaN was grown through a flux method on the seed substrate 100. The crystal growth temperature was 860° C., and the crystal growth pressure was 3 MPa. Na of 16 g was used as alkali metal, Ga of 11 g was used as Group III metal, and nitrogen gas was supplied. 0.6 mol % C was added to Na. The growth time was 40 hours. The crucible 12 was made of alumina. Thus, a GaN crystal 106 as the object layer was grown so as to have a thickness of 0.6 mm on the seed substrate 100 (refer to FIG. 7A). Since the high dislocation density region 103A was melted back, cavities 109 was formed.

After termination of growth, the crucible 12 was taken out after the temperature was cooled down to ambient temperature. Na and Ga were removed with ethanol or the like. The GaN crystal 106 was peeled off from the seed substrate 100, and no fracture or crack was found both in the GaN crystal 106 and the base substrate 102 (refer to FIG. 7B).

By visually observing the rear surface of the GaN crystal 106 (the surface in contact with the seed substrate 100) and the surface of the base substrate 102, it was found that the surfaces are in a mirror state. By reflecting a light emitted from the fluorescent light toward the rear surface of the GaN crystal 106 and the surface of the base substrate 102, a rainbow spectrum was observed. It is assumed that the periodic pattern made by the low dislocation density region 103B and the high dislocation density region 103A is transferred on the rear surface of the GaN crystal 106, and periodic irregularities are formed on the rear surface of the GaN crystal 106, as a result, the periodic irregularities function as a diffraction grating.

The outer shape of the GaN crystal 106 was faceted to a shape close to a hexagon. By evaluating the rear surface side (N-polar plane of c-plane) of the GaN crystal 106 with the X-ray diffraction method, it is found that full width at half maximum of 004 ω was 170 seconds in average.

In the SEM observation of the rear surface of the GaN crystal 106, a lot of holes formed by removing GaN have been observed. These dots corresponded to the high dislocation density region 103A of the seed substrate 100. From this, it was confirmed that the high dislocation density region 103A was melted back at an initial stage of crystal growth through a flux method, and thereafter, a GaN crystal 106 was grown to cover the holes formed due to melting back, resulting in the generation of cavities.

Next, the peeled GaN crystal 106 having a diameter of two inches was ground to form a GaN wafer having a thickness of 0.4 mm. By CL (cathode luminescence) observation and etch pit observation of the surface of the GaN wafer, the dislocation density was $2\times10^7/cm^2$, and the crystal had a low dislocation density and a good quality. Moreover, when the surface (Ga polar surface of c-plane) of the GaN wafer was evaluated by X-ray diffraction method, full width at half maximum of 004 ω was 120 seconds in average. Through evaluation of the off-angle distribution, it was found that the off-angle distribution width was approximately 0.10, and the warpage of the peeled GaN crystal 106 was small.

From these results, it was found that the GaN crystal 106 which was grown on the seed substrate 100 through a flux method and peeled off was a high-quality crystal having a high crystallinity and less warpage.

Embodiment 2

Figure 7A:
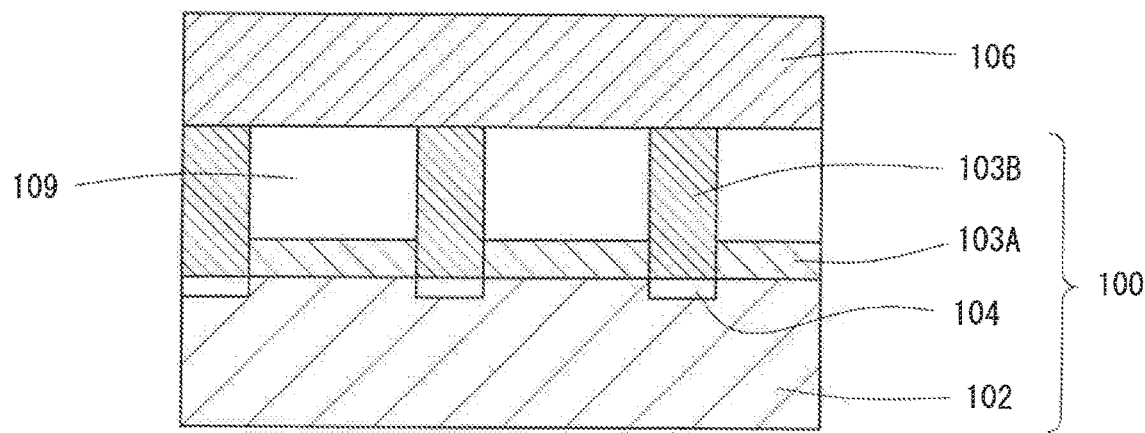
FIGS. 7A and 7B are sketches showing processes for producing a GaN crystal according to Embodiment 1.
Figure 7B:
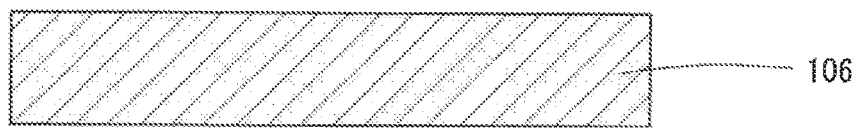

In Embodiment 1, the diameter of the seed substrate 100 was two inches, and the GaN crystal 106 was grown through a flux method for 40 hours so as to have a thickness of 0.6 mm in FIG. 7A. In Embodiment 2, the diameter of the seed substrate 100 was three inches, and the GaN crystal 106 was grown through a flux method for 160 hours so as to have three types of thicknesses of 0.9 mm, 1.1 mm, and 1.3 mm.

Figure 5D:
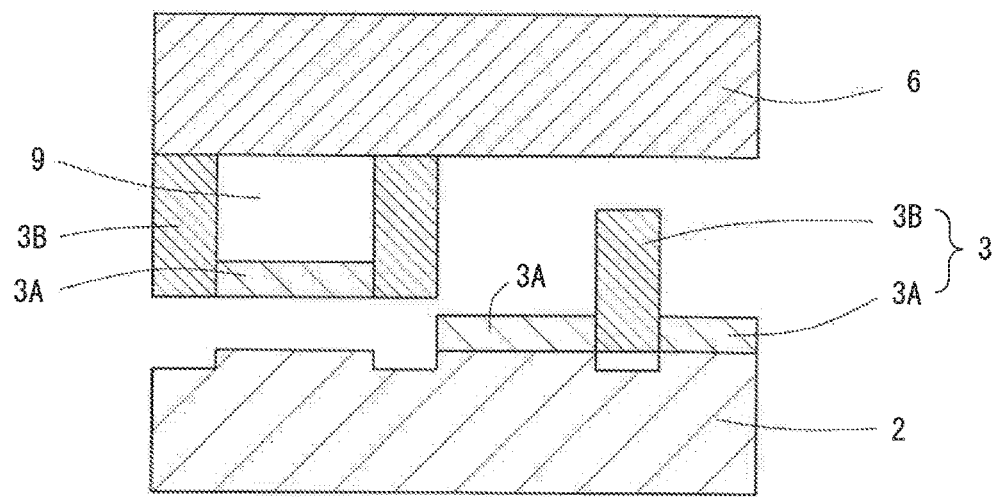

Three crucibles 12 were prepared. The Ga mole ratio of each crucible 12 was 18 mol %, 22 mol %, and 25 mol %, respectively. The liquid level was 7 mm in all crucibles. The growth conditions such as pressure and temperature were the same as in Embodiment 1. The growth time was 160 hours. In each crucible 12, the GaN crystal 106 grown on the seed substrate 100 had a thickness of 0.9 mm, 1.1 mm, and 1.3 mm, respectively. After the temperature was cooled down to room temperature, the GaN crystal 106 and the seed substrate were taken out from each crucible. The flat GaN crystal 106 grown through a flux method was peeled off from the sapphire substrate 2 as shown in FIG. 5D.

Thus-obtained three flat plates made of GaN crystal 106 had no cracks or fracture. Both surfaces of the flat plates made of GaN crystal 106 were ground to form GaN wafers having no cracks. It was observed that these GaN wafers were flat, and had less warpage enough to form an element layer by epitaxial growth or the like. Thus, warpage can be suppressed on even a wafer having a large diameter of three inches or more according to the present invention. No defects such as inclusion were found by visual observation.

The full width at half maximum in 004 ω scanning spectrum by XRD (X-ray diffraction) was 100 seconds. This value was slightly improved than the full width at half maximum of the flat plate made of GaN crystal 106 having a thickness of 0.6 mm in Embodiment 1. It appears that the reason of the improvement is an increase of the thickness of the GaN crystal 106.

The Group III nitride semiconductor grown according to the present invention can be used as a growth substrate for Group III nitride semiconductor device.

What is claimed is:

1. A method for producing a Group III nitride semiconductor by growing a Group III nitride semiconductor, through a flux method using a molten mixture of alkali metal and a Group III metal, on a seed substrate,
    wherein the seed substrate includes a base substrate and a base layer comprising a Group III nitride semiconductor grown on the base substrate,
    wherein a distribution of a dislocation density in the base layer has a two-dimensional periodic distribution in a direction parallel to a main surface thereof,
    wherein the base layer has a high dislocation density region and a low dislocation density region having a dislocation density lower than that of the high dislocation density region, and the distribution of the dislocation density has a two-dimensional periodic pattern comprising the high dislocation density region and the low dislocation density region, and wherein a method for producing the seed substrate comprises:

forming a precursor layer of the base layer on the base substrate;

forming a trench so as to reach the base substrate in the precursor layer by etching and making the remaining portion except the trench of the precursor layer the high dislocation density region; and forming the low dislocation density region by laterally regrowing a Group III nitride semiconductor from a side surface of the trench through metalorganic chemical vapor deposition (MOCVD) and covering the trench to make the base layer.

2. The method for producing a Group III nitride semiconductor according to claim 1, wherein the high dislocation density region has a planar honeycomb pattern in which regular hexagons are arranged in an equilateral triangular lattice, and the low dislocation density region has a planar pattern which fills spaces among the regular hexagons of the high dislocation density region.

3. A method for producing a Group III nitride semiconductor by growing a Group III nitride semiconductor, through a flux method using a molten mixture of alkali metal and Group III metal, on a seed substrate, wherein the seed substrate includes a base substrate and a base layer comprising a Group III nitride semiconductor grown on the base substrate, and wherein a distribution of a dislocation density in the base layer has a two-dimensional periodic distribution in a direction parallel to the main surface thereof, wherein the base layer has a high dislocation density region and a low dislocation density region having a dislocation density lower than that of the high dislocation density region, and the distribution of the dislocation density has a two-dimensional periodic pattern comprising the high dislocation density region and the low dislocation density region, wherein a method for producing the seed substrate comprise:

forming a precursor layer of the base layer on the base substrate;

forming a trench so as to reach the base substrate in the precursor layer and making the remaining portion except the trench of the precursor layer the high dislocation density region; and forming the low dislocation density region b y laterally re win a Group III nitride semiconductor from a side surface of the trench and covering the trench to make the base layer, and wherein, in the forming the trench, the trench is formed so as to etch the base substrate, and, in the forming the low dislocation density region, a hollow remains between the base substrate and the low dislocation density region by preventing the trench formed on the base substrate from being filled with the low dislocation density region.

4. The method for producing a Group III nitride semiconductor according to claim 3, wherein the high dislocation density region has a planar honeycomb pattern in which regular hexagons arranged in an equilateral triangular lattice, and the low dislocation density region has a planar pattern which fills spaces among the regular hexagons of the high dislocation density region.

5. The method for producing a Group III nitride semiconductor according to claim 3, wherein the high dislocation density region is melted back at an initial stage of crystal growth of an object layer comprising a Group III nitride semiconductor through a flux method, and thereafter, the object layer is formed so as to cover holes formed due to melting back on a top surface of the low dislocation density region, and to remain cavities between the object layer and the high dislocation density region.

6. The method for producing a Group III nitride semiconductor according to claim 4, wherein the high dislocation density region is melted back at an initial stage of crystal growth of an object layer comprising a Group III nitride semiconductor through a flux method, and thereafter, the object layer is formed so as to cover holes formed due to melting back on a top surface of the low dislocation density region, and to remain cavities between the object layer and the high dislocation density region.

7. The method for producing a Group III nitride semiconductor according to claim 1, wherein the high dislocation density region is melted back at an initial stage of crystal growth of an object layer comprising a Group III nitride semiconductor through a flux method, and thereafter, the object layer is formed so as to cover holes formed due to melting back on a top surface of the low dislocation density region, and to remain cavities between the object layer and the high dislocation density region.

8. The method for producing a Group III nitride semiconductor according to claim 2, wherein the high dislocation density region is melted back at an initial stage of crystal growth of an object layer comprising a Group III nitride semiconductor through a flux method, and thereafter, the object layer is formed so as to cover holes formed due to melting back on a top surface of the low dislocation density region, and to remain cavities between the object layer and the high dislocation density region.

9. The method for producing a Group III nitride semiconductor according to claim 3, wherein the average dislocation density of the base layer is $5 \times 10^8/cm^2$ or less.

10. The method for producing a Group III nitride semiconductor according to claim 3, wherein the seed substrate has a diameter of two inches or more.

* * * * *